United States Patent [19]
Sanada

[11] Patent Number: 4,841,488
[45] Date of Patent: Jun. 20, 1989

[54] SEMICONDUCTOR MEMORY CIRCUIT WITH IMPROVED TIMING AND DELAY CONTROL FOR DATA READ OUT

[75] Inventor: Kohji Sanada, Tokyo, Japan
[73] Assignee: NEC Corporation, Tokyo, Japan
[21] Appl. No.: 36,765
[22] Filed: Apr. 8, 1987
[30] Foreign Application Priority Data
Apr. 8, 1986 [JP] Japan .................................. 61-81711
[51] Int. Cl.$^4$ .......................... G11C 7/00; G11C 11/40
[52] U.S. Cl. .................................... 365/233; 365/194; 365/189.01; 365/189.07
[58] Field of Search ............... 365/189, 230, 190, 233, 365/194

[56] References Cited
U.S. PATENT DOCUMENTS

| | | | |
|---|---|---|---|
| 4,337,523 | 6/1982 | Hotta et al. | 365/233 |
| 4,573,145 | 2/1986 | Ozawa | 365/233 |
| 4,679,173 | 7/1987 | Sato | 365/230 |
| 4,682,048 | 7/1987 | Ishimoto | 365/233 |
| 4,710,903 | 12/1987 | Hereth et al. | 365/194 |

FOREIGN PATENT DOCUMENTS
0095179 11/1983 European Pat. Off. .

Primary Examiner—Stuart N. Hecker
Assistant Examiner—Alfonso Garcia
Attorney, Agent, or Firm—Sughrue, Mion, Zinn, Macpeak & Seas

[57] ABSTRACT

A memory circuit which can be reset to an inactive stand-by mode rapidly as soon as a chip select signal is changed to an inactive level, is disclosed. The memory circuit employs a first internal control signal for enabling a selection circuit for memory cells and a second internal control signal for enabling an output circuit and is featured in that the first control signal is activated more rapidly then the second control signal in response to the active level of the chip select signal and the second control signal is deactivated more rapidly than the first control signal in response to the inactive level of the chip select signal.

5 Claims, 4 Drawing Sheets

SEMICONDUCTOR MEMORY CIRCUIT WITH IMPROVED TIMING AND DELAY CONTROL FOR DATA READ OUT

BACKGROUND OF THE INVENTION

The present invention relates to a semiconductor memory circuit, and particularly to a static type semiconductor memory circuit controlled by a chip select signal.

Static type memory circuits have been utilized in various fields as high speed memories.

A static memory is controlled by a chip select signal ($\overline{CS}$) between an active state for achieving a reading or writing operation and an inactive state in which the memory is set at a stand-by mode in order to implement a high speed operation with a low power consumption. The chip select signal $\overline{CS}$ is received by a clock input buffer of the memory and the clock input buffer generates an internal control signal for actually controlling peripheral circuits such as addressing circuits and an output circuit included in the memory.

When the chip selection signal is brought into its active level, e.g. low level, the internal control signal is set at an active level, e.g. low level so that the peripheral circuits are enabled for a reading or writing operation. While, when the chip selection signal is changed into its inactive state, the internal control signal is also set at its inactive level (e.g. high level) so that the peripheral circuits are disenabled and set at a stand-by mode.

In order to achieve a high-speed operation, it is necessary to generate the active level of the internal control signal quickly as soon as the chip select signal is changed to the active level from the inactive level. Therefore, the clock input buffer receiving the chip select signal has been designed to generate the active level of the internal control signal rapidly in response to the change of the chip select signal from the inactive level to the active level, as compared to the case where the clock input buffer generates the inactive level of the internal control signal in response to the change of the chip select signal from the active level to the inactive level.

Namely, in the case where the active level and the inactive level of the internal control signal are a low level and a high level, respectively, a lower potential side drive transistor for pulling down the output of the clock input buffer is designed to have a large current ability while a higher potential side drive transistor for pulling-up the output of the clock input buffer is designed to have a small current ability.

Accordingly, the clock input buffer generates the active level of the internal control signal rapidly to enable the peripheral circuit. However, the clock input buffer generates the inactive level of the input control signal with a relatively large delay time from a time when the chip select signal has changed from the active level to the inactive level, and therefore the peripheral circuits are still enabled for the period corresponding to the above delay time even after the chip select signal has changed to the inactive level. Thus, the memory inevitably produces an output signal after the chip select signal has changed to the inactive level.

In general, an output terminal of a memory circuit is connected to a bus line to which another functional circuit is connected, and therefore, the above phenomenon that the memory produces a read out signal after the chip select signal thereto has changed to the inactive level makes the effective speed of the memory slow and the utilization ratio of the bus line is also lowered.

SUMMARY OF THE INVENTION

It is one object of the present invention to provide a memory circuit which can operate at a high speed as a whole.

It is another object of the present invention to provide a static memory circuit which can set an output circuit at a high impedance state with a reduced delay time after a change of a chip select signal to its inactive level without increasing access time.

The memory circuit according to the present invention comprises an array of memory cells, a selection circuit for selecting a memory cell or cells to be accessed in accordance with address signals, an output circuit for producing an output signal in accordance with data from the selected memory cell, and a control circuit for generating a control signal for enabling the selection circuit and the output circuit in response to an external control signal, and is featured in that the control circuit includes a first buffer circuit for generating an active level of a first control signal a first delay time after a change of the external control signal from its inactive level, to an active level and for generating an inactive level of a first control signal a second delay time after a change of the external control signal from its active level to an inactive level, a second buffer circuit for generating an active level of a second control signal a third delay time after a change of the external control signal from the inactive level to the active level, and an inactive level of a second control signal a fourth delay time after a change of the external control signal from the active level to the inactive level, the first delay time being shorter than the third delay time, the fourth delay time being shorter than the second delay time, first control means responsive to the first control signal for enabling the selection circuit, and second control means responsive to the second control signal for enabling the output circuit. According to the present invention, the output circuit is controlled by the second control signal which is immediately deactivated as soon as the external control signal is changed to the inactive level, and hence the output circuit is immediately disenabled to make an output floating period shorter.

DETAILED DESCRIPTION OF THE INVENTION

Figure 1:
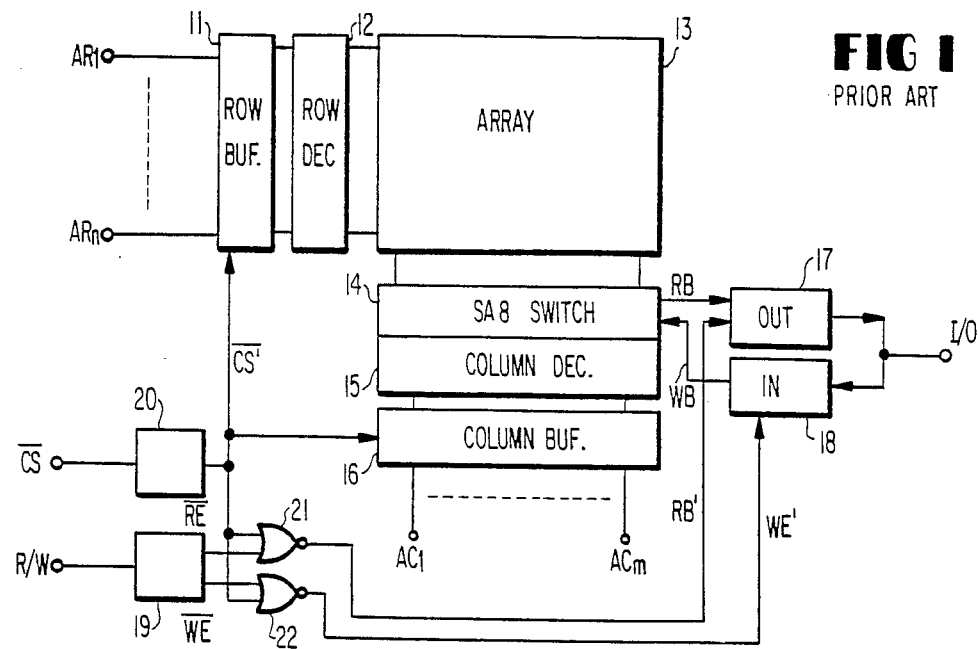
FIG. 1 is a schematic block diagram of a memory circuit according to a prior art.

FIG. 1 shows a major structure of a memory according to a prior art.

A plurality of static type memory cells are arranged in rows and columns with word lines in rows and digit lines in columns (not shown) in a memory cell array 13. Row address signals AR1 to ARn are applied to a row address buffer 11 which develops their true and complementary signals. A row decoder 12 receives the true and complementary address signals from the row address buffer 11 to select one of the word lines in the rows of the memory array 13.

A plurality of column address signals AC1 to ACm are applied to a column address buffer 16 and their true and complementary signals are generated by the column address buffer 16. A column decoder 15 selects sense amplifiers to be connected to a read data line RB in a sense amplifier and switch block 14 or digit lines to be connected to a write data line WB via the block 14. An output circuit 17 has an input connected to the read data line RB and an output connected to a data input-/output terminal I/O and generates a read out signal to the I/O terminal in a read mode. An input circuit 18 operatively outputs a write signal to the input data line WB in response to an input signal applied to the I/O terminal in a write mode.

A clock input buffer 20 receives a chip select signal $\overline{CS}$ which controls the memory between an active state and an inactive state, and generates an internal control $\overline{CS'}$. The internal control signal $\overline{CS'}$ is applied to the row address buffer 11 and the column address buffer 16 and to the respective inputs of NOR gates 21 and 22.

A read/write control signal R/W is applied to a control input buffer 19 which generates a low level of read enable signal $\overline{RE}$ when R/W is at low in level and a low level of write enable signal $\overline{WE}$ when R/W is at high in level. The signal $\overline{RE}$ is synchronized with the internal control signal $\overline{CS'}$ by the NOR gate 21 to generate a read execution signal RE' for enabling the output circuit 17 in a read mode. The signal $\overline{WE}$ is synchronized with the internal control signal $\overline{CS'}$ by the NOR gate 22 and when both of $\overline{WE}$ and $\overline{CS'}$ are at low in levels, a high level of a write execution signal WE' for enabling the input circuit 18 is generated.

In the above memory, the chip select signal $\overline{CS}$ works as the basic control signal to the memory, and the internal control signal $\overline{CS'}$ actually controls the peripheral circuits.

Figure 2:
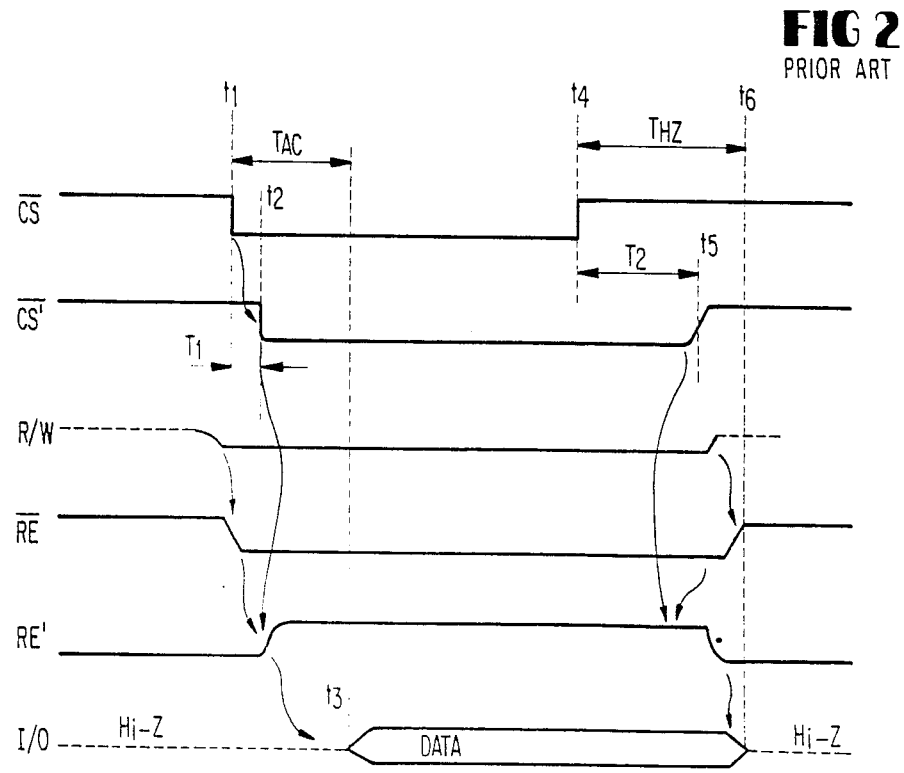
FIG. 2 is a timing chart showing an operation of the memory of FIG. 1.

Referring to FIG. 2, an operation of the memory of FIG. 1 is explained.

At a time $t_1$, the signal $\overline{CS}$ is changed from a high (inactive) level to a low (active) level. The signal $\overline{CS'}$ is changed from a high (inactive) level to a low (active) level at a time $t_2$ which is delayed by a period $T_1$ from the time $t_1$. The period $T_1$ is determined by a response time of the buffer 20 for the low level input of $\overline{CS}$. While the signal R/W is set at a low to designate a read mode and the signal $\overline{RE}$ is changed to a low level prior to the time $t_1$.

Therefore, at the time $t_2$, the high (active) level of RE' is also generated. Thus, the peripheral circuits such as the buffers 11, 16 and the output circuit 17 are enabled to commence actually a read operation, and at a time $t_3$, a valid data is produced to the I/O terminal.

Then, at a time $t_4$, the signal $\overline{CS}$ is changed from the low level to the high level, and hence the internal control signal S' is also changed to the high (inactive) level from the low level at a time $t_5$ which is after $t_4$ by a period $T_2$. The period $T_2$ is longer than the period $T_1$. The period $T_2$ corresponds to a response time of the buffer 20 to the change of $\overline{CS}$ from the low level to the high level. In response to this, the signal RE' is changed from the high level to the low level and the peripheral circuits are disenabled and the terminal I/O is rendered at a high impedance state (Hi-Z) at a time $t_6$.

In FIG. 2, a period $T_{AC}$ from $t_1$ to $t_3$ is corresponds to an access time of the memory, and a period $T_{HZ}$ from $t_4$ to $t_6$ is an output floating time during which the memory still outputs the valid data although the signal $\overline{CS}$ is already set to the high level.

Figure 3:
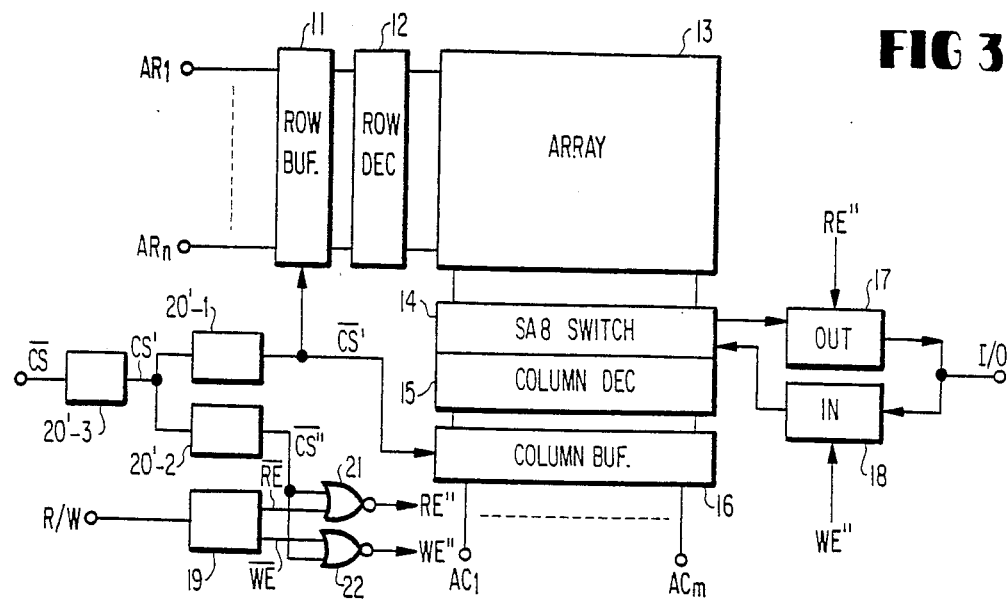
FIG. 3 is a schematic block diagram of a memory circuit according to one embodiment of the present invention.

Since the response time $T_1$ of the buffer 20 is designed short in order to make $T_{AC}$ short, the response time $T_2$ of the buffer is sacrificed for the purpose of short $T_{AC}$, the data output is undesirably produced at the I/O during a relatively long period of $T_{HZ}$. This in fact lowers the effective operation speed of the memory and also lowers the utilization rate of the bus line connected to the terminal I/O. FIG. 3 shows one embodiment of the present invention.

This embodiment is achieved by inverters 20'-1 to 20'-3 in place of the buffer 20 in FIG. 1.

The inverter 20'-3 works as an inverted buffer to generate an inverted signal CS' with respect to $\overline{CS}$ at a high speed. A response time of the inverter 20'-3 to the change of a low level input to a high level input is almost the same as that of a high level input to a low level input. The inverter 20'-1 develops a low level output ($\overline{CS'}$) in response to a high level of CS' at a high but it develops a high level output ($\overline{CS'}$) in response to a low level of CS' at a relatively low speed. To the contrary, the inverter 20'-2 has the opposite delay response characteristics with respect to the inverter 20'-1. Namely, the inverter 20'-2 develops a high level output ($\overline{CS''}$) in response to a low level input (CS') at a high speed while it develops a low level output ($\overline{CS''}$) in response to a high level input (CS') at a relatively low speed. The output $\overline{CS'}$ of the inverter 20'-1 is applied to the peripheral circuits such as the row address buffer 11 and the column address buffer 16 other than the output circuit 17 and the input circuit 18. The output CS'' of the inverter 20''-2 is used to synchronize the signal $\overline{RE}$ and the signal $\overline{WE}$ by the NOR circuits 21 and 22 and the outputs RE'' and WE'' are applied to the output circuit 17 and the input circuit 18 for enabling them, respectively.

Figure 5:
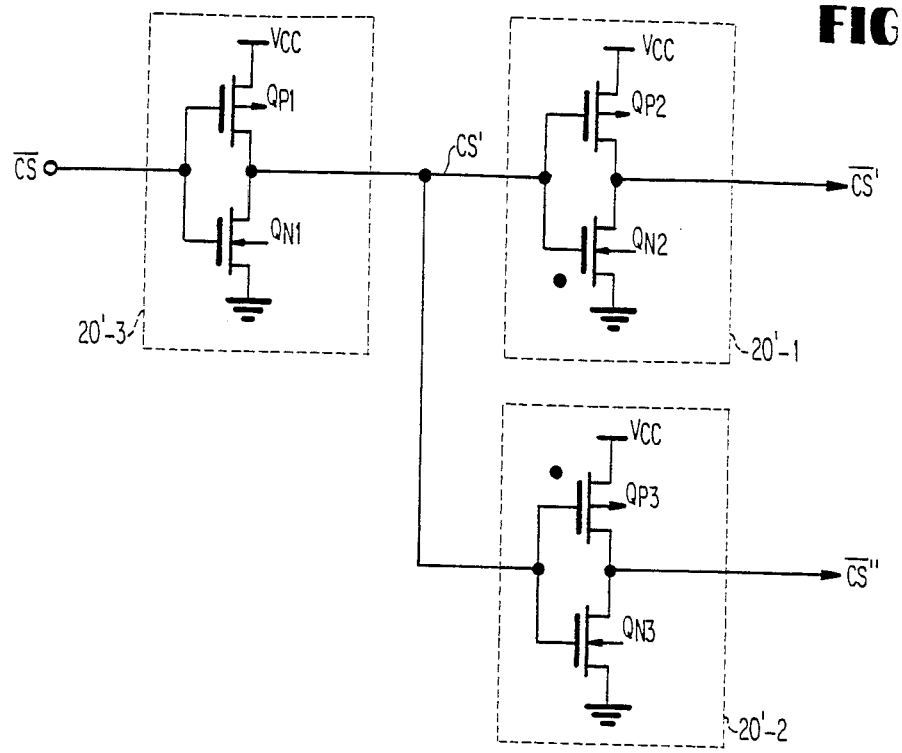
FIG. 5 is a circuit diagram showing the clock input buffer employed in the memory of FIG. 3.

Examples of detailed structures of the inverters 20'-1 to 20'-3 are shown in FIG. 5.

The inverter 20'-3 is composed of a P-channel field effect transistor (FET) QP1 and an N-channel FET QN1. The ratio WP1/LP1 of a channel width WP1 to a channel length LP1 of FET QP1 and the ratio WN1/LN1 of a channel width WN1 to a channel length LN1 are selected approximately the same. Namely, [WP1/LP1]≃[WN1/LN1] is provided.

The inverter 20'-1 is composed of a P-channel FET QP2 and an N-channel FET QN2. The ratio of [WP2/LP2] of a channel width WP2 to a channel length LP2 of FET QP2 is selected smaller than the ratio WN2/LN2 of a channel width WN2 to a channel length LN2 of FET QN2. Namely, WP2/LP2 < WN2/LN2 is satified. [WN2/LN2] is preferably made larger than WP2/LP2 by three times or more. In this embodiment, [WP2/LP2]: [WN2/LN2] = 1: 10.

The inverter 20'-2 is composed of a P-channel FET QP3 and an N-channel FET QN3. The ratio [WP3/LP3] of a channel width WP3 to a channel length LP3 of FET QP3 is made larger than the ratio WN3/LN3 of a channel width WN3 to a channel length LN3 of FET QN3. [WP3/LP3] is preferably made larger than [WN3/LN3] by three times or more. In this embodiment, [WP3/LP3]: [WN3/LN3] = 10:1 is provided.

In other words, the conductance or current flowing ability of QN2 is set larger than that of QP2 in the inverter 20'-1, and the conductance or current flowing ability of QP3 is set larger than that of QN3 in the inverter 20'-2.

Thus, the inverter 20'-1 responds to the change of CS' from a low level to a high level to change the output $\overline{CS'}$ from a high level to a low level rapidly.

Similarly, the inverter 20'-2 responds to the change of CS' from a high level to a low level to change the output $\overline{CS''}$ from a low level to a high level rapidly.

Figure 6:
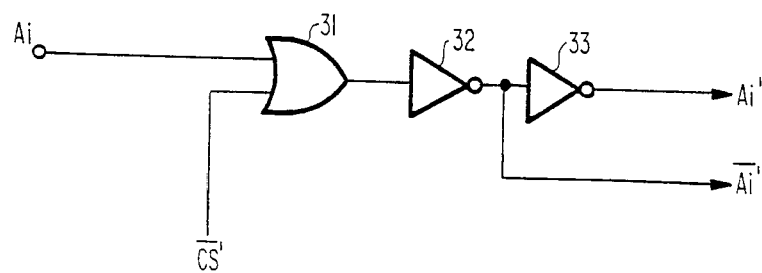
FIG. 6 is a schematic block diagram showing a part of the row address buffer.

FIG. 6 shows a part of the row address buffer 11 with respect to one bit input $A_i$.

A NOR gate 31 transmits the address input Ai when the signal $\overline{CS'}$ is at low and inverters 32 and 33 produce complementary and true address signals $\overline{A_i'}$ and $A_i'$, respectively.

Figure 7:
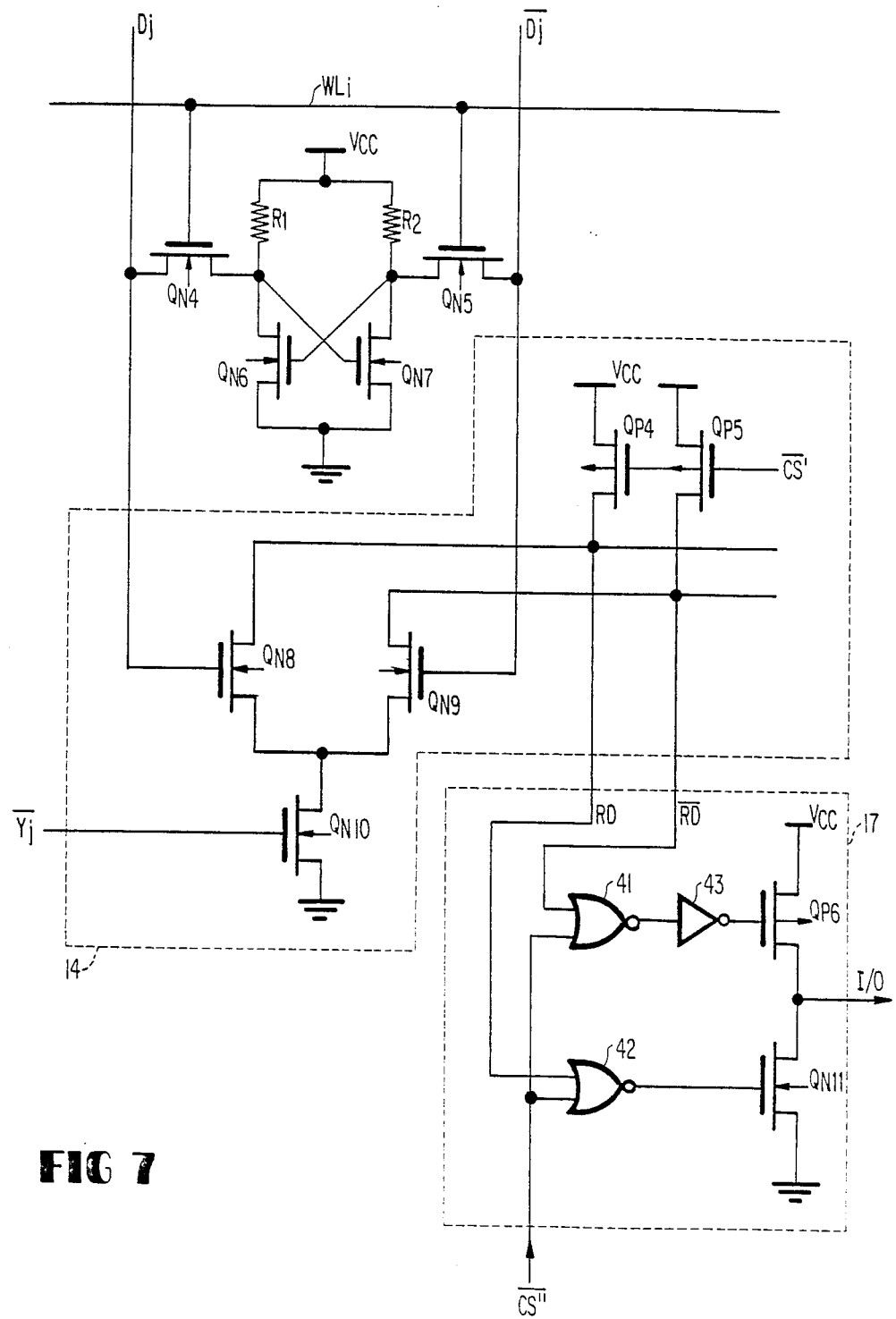
FIG. 7 is a schematic circuit diagram showing major part of the memory of FIG. 3.

FIG. 7 shows an example of detailed structure of major part of the memory.

Each memory cell is made of a flip-flop composed of a pair of load resistors R1 and R2, a pair of N-channel drive FETs QN6 and QN7, and a pair of N-channel transfer gate FETs QN4 and QN5. A word line WLi is connected to gates of FETs QN4 and QN5, and a pair of digit lines Dj and $\overline{Dj}$ are provided in each column. The sense amp and switch block 14 includes a gated-type differential amplifier composed of N-channel input FETs QN8 and QN9 having gates coupled to the digit lines Dj and $\overline{Dj}$ and a switch FET QN10 having a gate receiving one of output Yj from the column decoder 15, and a pair of common load P-channel FETs QP4 and QP5 controlled by CS'.

Figure 4:
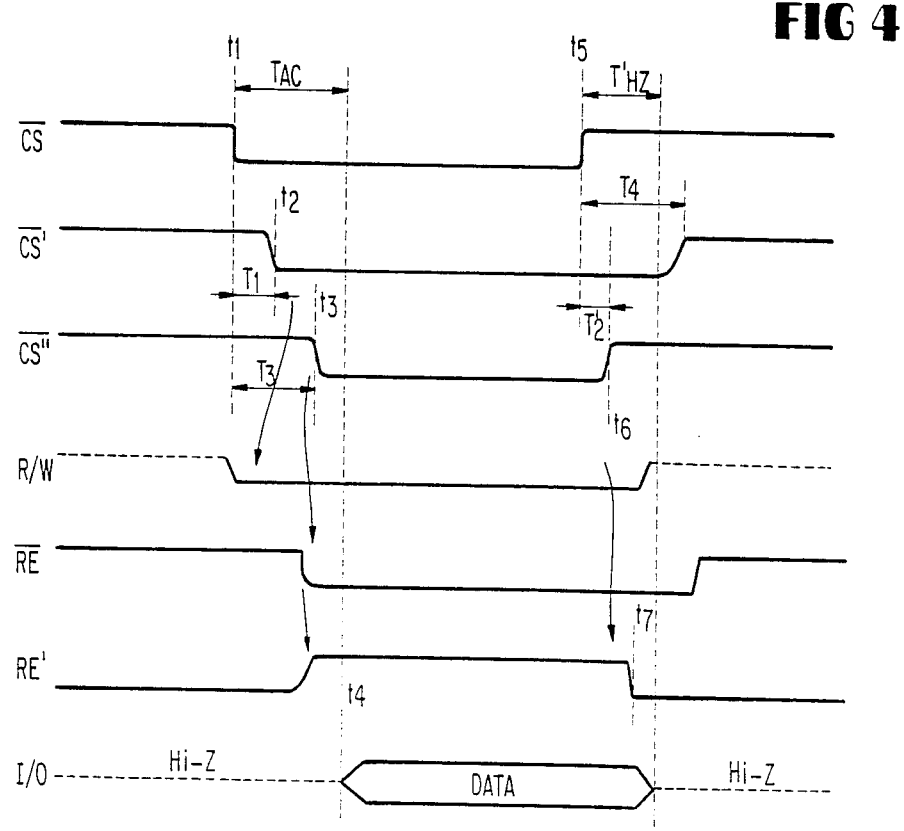
FIG. 4 is a timing chart showing an operation of the memory of FIG. 3.

The output circuit 17 includes a NOR gate receiving $\overline{CS''}$ and a complement read data line RB, a NOR gate 42 receiving $\overline{CS''}$ and a true read data line RB, an inverter 43 and an output inverter composed of a P-channel FET QP6 and an N-channel FET QN11. The NOR gate 42 transmits data on the line RB to a gate of FET QN11 and data on the line $\overline{RB}$ is transmitted via the NOR gate 41 and inverted by the inverter 43 for driving FET QP6 when $\overline{CS''}$ is at low in level. When $\overline{CS''}$ is at high in level, the outputs of the NOR gates 41 and 42 are kept at low, and therefore the gate potentials of FETs QP6 and QN11 are a high level and a low level, respectively. Thus, both of FETs QP6 and QN11 are rendered non-conductive so that the terminal I/O is set at a high impedance (floating) state. FIG. 4 shows an operation of the memory of FIG. 3.

At a time $t_1$, the signal $\overline{CS}$ is changed from a high level to a low level. Then, the inverter 20'-1 changes its output $\overline{CS'}$ from a high level to a low level at a time $t_2$ which is later from $t_1$ by a relatively short period $T_1$. Therefore, the peripheral circuits for achieving selection of memory cells are enabled except the output circuit 17 and the input circuit 18. Then, at a time $t_3$ which is after $t_2$, the inverter 20'-2 changes its output $\overline{CS''}$ from a high level to a low level and the signal RE' is changed to a high level. Thus, the output circuit 17 is enabled and an output data (DATA) is produced at I/O at a time $t_4$.

At a time $t_5$, the signal $\overline{CS}$ is reset to a high level. In response to this change of $\overline{CS}$, the inverter 20'-2 changes its output $\overline{CS''}$ at a time $t_6$ which is shortly after $t_5$ by a period $T'_2$, while the inverter 20'-1 responds to this change of $\overline{CS}$ after a longer period $T_4$ has elapsed from $t_5$.

Thus, in response to the change of $\overline{CS''}$ at $t_6$, the signal RE' is deactivated at a time $t_7$ so that the output circuit 17 is disenabled. Therefore, the terminal I/O is set at a high-impedance state.

Since the response time $T_2'$ of the inverter 20'-2 is set shorter than that $T_4$ of the inverter 20'-1, the output circuit 17 is disenabled immediately after the signal $\overline{CS}$ is reset to a high level. Thus, a short high floating period $T'_{Hz}$ can be obtained.

As has been explained above, the memory according to the present invention can operate at a high speed.

Although, in the above embodiment, the signal $\overline{CS'}$ is applied to a plurality of peripheral circuits other than the output circuit and the input circuit, it is also practical to generate a plurality of sub-control signals each applied to each peripheral circuit in accordance with the signal CS'.

I claim:

1. A memory circuit comprising:
   an array of memory cells;
   a selection circuit for operatively selecting at least one of the memory cells;
   an output terminal;
   an output circuit having an input end and an output end, said output end being coupled to said output terminal, said output circuit operatively generating, when enabled, and output signal at said output terminal in accordance with a level at the input end, and said output circuit setting, when disabled, said output terminal at a high impedance state;
   first means, coupled to said selection circuit and said input end of said output circuit, for applying a data signal derived from the selected memory cell to said input end of said output circuit;
   second means receiving an external control signal assuming one of active and inactive levels;
   first and second control signal generators each coupled to said second means, said first and second control signal generators generating first and second active level control signals with first and second delay times, respectively, when said external control signal changes to an active level, and generating first and second inactive control signals with third and fourth delay times, respectively, when said external control signal changes to an inactive level, said first delay time being shorter than said second delay time, and said fourth delay time being shorter than said third delay time;
   third means coupled to said first control signal generator and said selection circuit, said third means enabling said selection circuit in response to the active level of said first control signal, and disenabling said selection circuit in response to the inactive level of said first control signal; and
   fourth means coupled to said second control signal generator and said output circuit, said fourth means enabling said output circuit in response to the active level of said second control signal, and disenabling said output circuit in response to the inactive level of said second control signal.

2. A memory circuit comprising:
an array of memory cells;
a selection circuit for operatively selecting at least one of the memory cells;
an output terminal;
an output circuit having an output end coupled to said output terminal, and an input end, said output circuit operatively producing at said output terminal, data corresponding to a signal at the input end thereof when said output circuit is enabled, and said output circuit setting said output terminal in a high impedance state when said output circuit is disabled;
means, coupled to said selection circuit and said output circuit, for supplying the input end of said output circuit with a signal derived from the memory cell selected by said selection circuit;
first means for receiving an external control signal having one of an active and an inactive level;
a first series circuit having a first field effect transistor connected between a first voltage line supplied with a first voltage and a first node, and a second field effect transistor connected between said first and a second voltage line supplied with a second voltage, a conductance of said first transistor being smaller than that of said second transistor;
a second series circuit having a third field effect transistor connected between said voltage line and a second node, and a fourth field effect transistor connected between said second node and said second voltage line, a conductance of said third transistor being larger than that of said fourth transistor;
second means coupled to said first means, said first series circuit and said second series circuit, said second means simultaneously rendering said second and fourth transistors conductive in response to the active level of said external control signal so that said second voltage is produced at said first node and thereafter produced at said second node, said second means simultaneously rendering said first and third transistors conductive in response to the inactive level of said external control signal so that said first voltage is produced at said second node and thereafter produced at said first node;
third means, coupled to said first node and said selection circuit, for enabling said selection circuit when said first node is approximately at said second voltage and disabling said selection circuit when said first node is approximately at said first voltage; and
fourth means, coupled to said second node and said output circuit, for enabling said output circuit when said second node is approximately at said second voltage and disabling said output circuit when said second node is approximately at said first voltage.

3. The memory circuit according to claim 2, wherein said first and third transistors are P-channel field effect transistors, and said second and fourth transistors and N-channel field effect transistors.

4. The memory circuit according to claim 2, wherein said second means includes a third series circuit having a fifth field effect transistor connected between said first voltage line and a third node, and a sixth field effect transistor connected between said third node and said second voltage line, a conductance of said fifth transistor being approximately the same as that of said sixth transistor.

5. The memory circuit according to claim 2, wherein said first and third transistors are of P-channel type and said second and fourth transistors are of N-channel type, the gates of said first to fourth transistors being connected to a third node in common, and said second means includes a fifth field effect transistor of P-channel type connected between said first voltage line and said third node and a sixth field effect transistor of N-channel type connected between said third node and second second voltage line, the gates of said fifth and sixth transistors being supplied with said external control signal.

* * * * *

UNITED STATES PATENT AND TRADEMARK OFFICE
CERTIFICATE OF CORRECTION

PATENT NO. : 4,841,488

DATED : June 20, 1989

INVENTOR(S) : Kohji SANADA

It is certified that error appears in the above-identified patent and that said Letters Patent is hereby corrected as shown below:

Col. 4, line 1, delete "S'" and insert --$\overline{CS}'$--

Col. 4, line 45, delete "CS''" and insert --$\overline{CS}''$--

Col. 5, line 42, delete "CS'" and insert --$\overline{CS}'$--

Col. 6, line 25, delete "CS'" and insert --$\overline{CS}'$--

Col. 7, line 23, after "first" insert --node--

Signed and Sealed this

Seventh Day of August, 1990

Attest:

HARRY F. MANBECK, JR.

*Attesting Officer*   *Commissioner of Patents and Trademarks*